United States Patent [19]

Bickley et al.

[11] 4,412,337

[45] Oct. 25, 1983

[54] POWER AMPLIFIER AND ENVELOPE CORRECTION CIRCUITRY

[75] Inventors: Robert H. Bickley, Scottsdale; Christopher D. Broughton; Thad J. Genrich, both of Mesa, all of Ariz.

[73] Assignee: Motorola Inc., Schaumburg, Ill.

[21] Appl. No.: 318,281

[22] Filed: Nov. 4, 1981

[51] Int. Cl.³ .............................................. H04B 1/03
[52] U.S. Cl. ..................................... 375/60; 330/149; 332/37 D; 455/126
[58] Field of Search ................... 328/162, 168; 330/75, 330/149; 343/108 R, 102; 375/60, 73; 455/126, 146

[56] References Cited

U.S. PATENT DOCUMENTS

| 3,668,533 | 6/1972 | Fish et al. | 455/126 |
| 4,039,951 | 8/1977 | Bruce et al. | 332/37 D |
| 4,237,555 | 2/1980 | Dishal | 332/37 D |
| 4,291,277 | 9/1981 | Davis et al. | 330/149 |
| 4,331,928 | 5/1982 | Heidt | 330/149 |

Primary Examiner—Benedict V. Safourek
Attorney, Agent, or Firm—Eugene A. Parsons

[57] ABSTRACT

Generating apparatus providing a preferred pulse envelope which is compared to the envelope of output pulses from a nonlinear power amplifier, the error between the two being used, along with a stored predistorted pulse, to generate an updated predistorted pulse that is utilized to modulate the input signal to the nonlinear amplifier to produce a pulse at the output thereof having the preferred envelope and to update the stored predistorted pulse.

16 Claims, 13 Drawing Figures

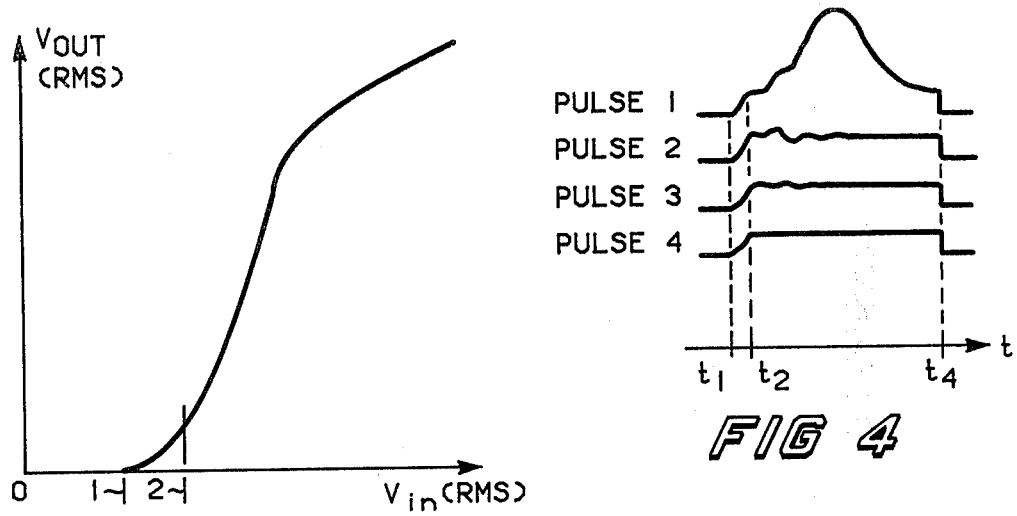
FIG 3
FIG 4
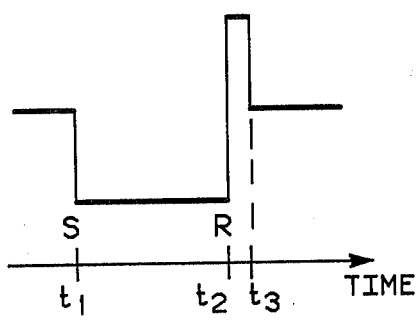
FIG 5
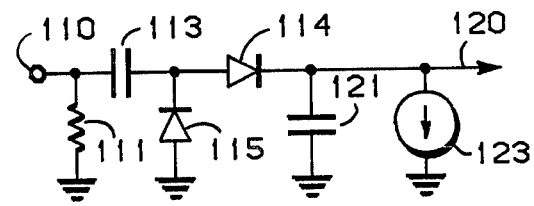
FIG 6
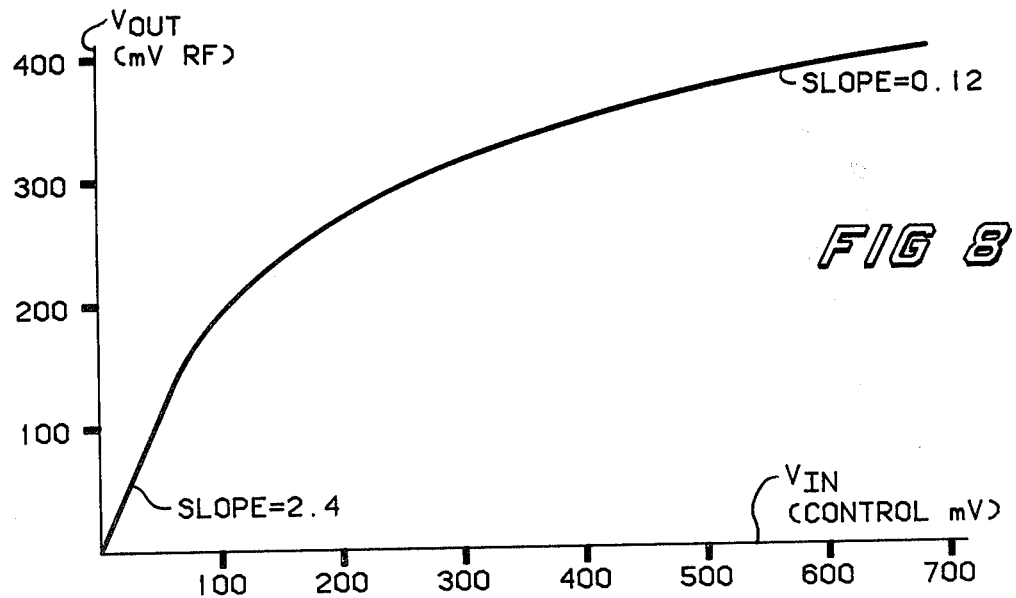
FIG 8

POWER AMPLIFIER AND ENVELOPE CORRECTION CIRCUITRY

BACKGROUND OF THE INVENTION

The present invention pertains to a power amplifier and envelope correction circuitry associated therewith. Power amplifiers, and especially semiconductor power amplifiers, can be very non-linear so that providing a preferred pulse envelope at the output thereof is extremely difficult. This is especially true if the duty cycle, or sequence, of a pulse train is not constant. Further, in many applications the peak pulse power may be relatively large so that temperature changes and the like within the circuitry of the power amplifier have a substantial and adverse effect.

As a specific example, TACAN ground station transponders, which provide distance, azimuth, and station identification information to properly equipped aircraft, must be capable of producing pulse trains wherein the time between pulses varies radically but the amplitude and shape of the pulses is closely controlled. In general, the shape of the pulse should be a smooth bell curve, or Gaussian wave form, to minimize the frequency spectrum occupied by the radiated energy so as not to interfere with adjacent channels in the TACAN system. Any variations in the shape of the output pulse may cause spectrum spreading, and may result in interference with adjacent TACAN channels. Any variations in the amplitude of the output pulse may cause erroneous navigational information.

In the prior art, the output pulse shape and amplitude is controlled with an analog loop around the power amplifier. The components of these circuits have many parts with carefully controlled values, and are expensive and difficult to manufacture. Further, to reduce the requirements of the analog loop the power amplifier must be constructed as linear as possible. Since the power amplifier, in a TACAN system for example, is an RF amplifier, the components are RF devices which are generally expensive and difficult to manufacture.

A typical example of prior art structure is disclosed in U.S. Pat. No. 4,237,555, entitled "Automatic Modulation System", issued Dec. 2, 1980. This structure includes several analog feedback loops and apparatus for generating a pedestal in the feedback.

While the TACAN navigational system is utilized herein as a specific example, it will be understood by those skilled in the art that a great variety of applications exist wherein precise control of the output of a nonlinear amplifier is required. Further, while a power amplifier is specified it will be clear to those skilled in the art that the present envelope correction circuitry can be manufactured independent of the amplifier.

SUMMARY OF THE INVENTION

The present invention pertains to envelope correction circuitry for use with a power amplifier, which circuitry includes envelope generating apparatus for generating a preferred envelope, a comparator coupled to sense the output of the power amplifier and compare the preferred envelope thereto, circuitry for utilizing the comparison to generate a predistorted envelope and modulating circuitry coupled to the input of the amplifier for modulating the input thereto with the predistorted envelope so that output pulses from the power amplifier have substantially the preferred envelope.

Further, the invention includes the use of the power amplifier and envelope correction circuitry in a TACAN navigation system wherein the preferred envelope takes the form generally described by the equation $$F(t) = \left[ \frac{\sin(2\pi K_o t)}{2K_o \pi t} \right]^3$$

where $K_o$ = a constant chosen for a specific rise time. As well as the method of correcting a power amplifier input to produce pulses with the preferred envelope at the output.

It is an object of the present invention to provide new and improved envelope correction circuitry for use with a power amplifier.

It is a further object of the present invention to provide new and improved envelope correction circuitry in association with a power amplifier, which circuitry causes the power amplifier to provide at the output thereof pulses having a predetermined preferred envelope.

It is a further object of the present invention to provide envelope correction circuitry wherein a preferred envelope is chosen having substantially zero energy at frequency components above a predetermined cutoff frequency.

These and other objects of the present invention will become apparent to those skilled in the art upon consideration of the accompanying specification, claims and drawings.

BRIEF DESCRIPTION OF THE DRAWINGS

Referring to the drawings,

FIG. 3 is the curve of a typical transfer function for a semiconductor type Class C power amplifier;

FIG. 4 illustrates a series of output waveforms present in the envelope correction circuitry of FIG. 1;

FIG. 5 generally illustrates the waveform of compensating circuitry incorporated in the circuitry of FIG. 1;

FIG. 6 is schematic diagram of a detector utilized in the circuitry of FIG. 1;

FIG. 8 is a typical waveform of the attenuation curve for a pin diode reflection modulator utilized in FIG. 1.

DESCRIPTION OF THE PREFERRED EMBODIMENTS

Figure 1:
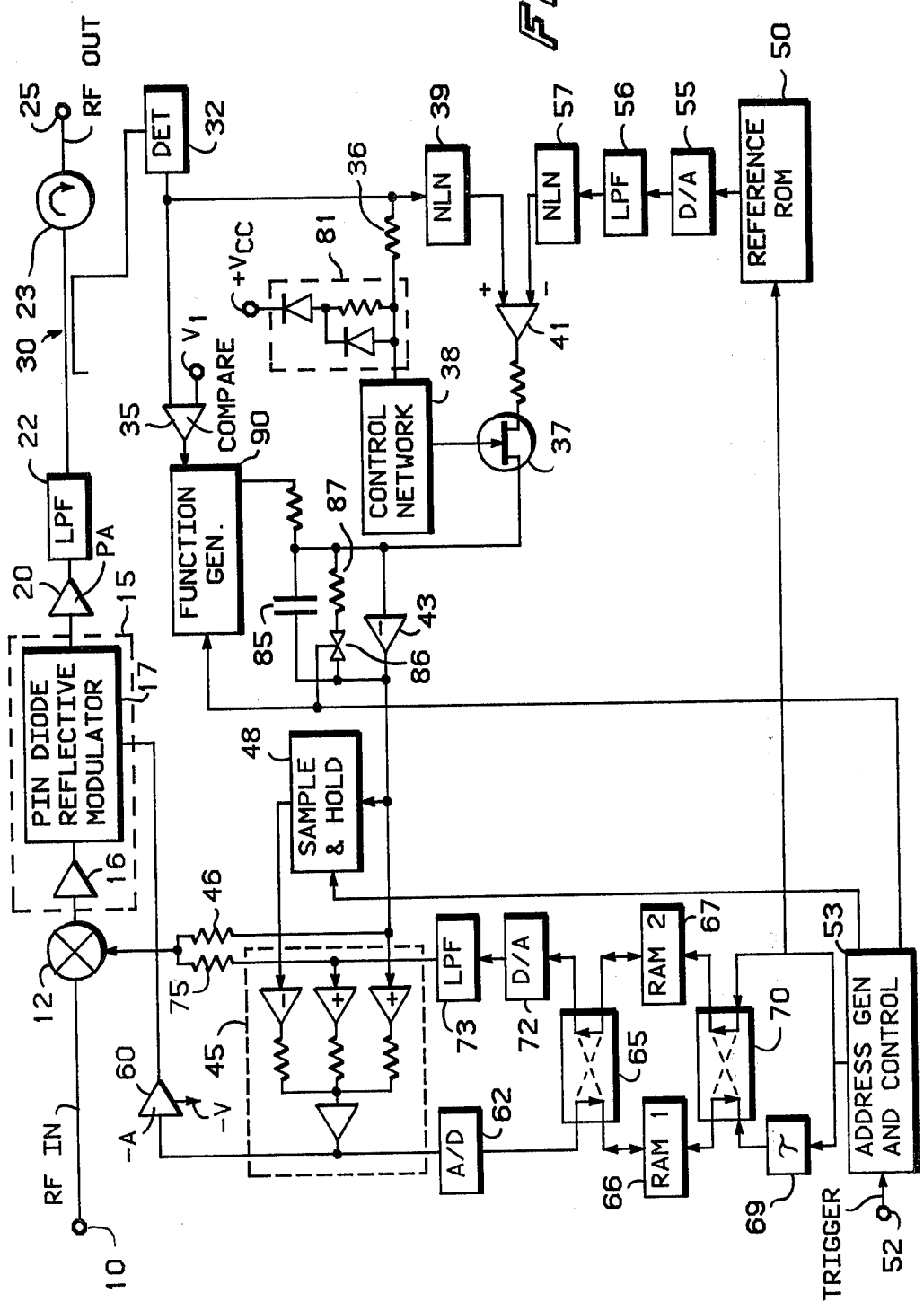
FIG. 1 is a simplified block diagram of a power amplifier and envelope correction circuitry incorporating the present invention.

Referring specifically to FIG. 1, a power amplifier and envelope correction circuit incorporating the present invention is illustrated. It will be understood by those skilled in the art that the circuitry illustrated in FIG. 1 is specifically adapted for use in a TACAN navigation system and some minor modifications may be required for other applications. An input terminal, designated 10, is designed to receive an RF signal from a source not shown. The RF at the terminal 10 is applied to one input of a first modulator 12. The output of the modulator 12 is supplied to a first input of a second modulator, generally designated 15, which includes an amplifier 16 and a pin diode reflective modulator 17. The output of the second modulator 15 is applied to the input of a power amplifier 20. It will of course be understood by those skilled in the art that while a power amplifier is specifically utilized in this embodiment that other types of amplifiers and circuits might be utilized in place of or in addition to the power amplifier 20. The output of the power amplifier 20 is connected through a low pass filter 22 and a circulator circuit 23 to an RF output terminal 25.

A coupling device 30, which in this embodiment is illustrated as a directional coupler, couples a small amount of the energy at the output of the low pass filter 22 to a detector 32. The detector 32 essentially follows the peak carrier level so that only the envelope of the output pulses from the low pass filter 22 is available at the output of the detector 32. The pulse envelope at the output of the detector 32 is supplied to an input of a comparator 35, a resistor 36, and a non-linear network 39. The comparator 35 has a second input with a fixed voltage, $V_1$, supplied thereto. The voltage $V_1$ will be explained presently. The output of the nonlinear network 39 is applied to one input of a summing amplifier or comparator circuit 41. The output of the summing amplifier 41 is supplied through a controlled resistance, 37 having its resistance value control derived from a control network 38 to the input of an integrator 43. The output of the integrator 43 is supplied to an input of a summing circuit generally designated 45, through a resistor 46 to a second input of the first modulator 12, and to the input of a sample and hold circuit 48. The integrator 43 is part of an analog feedback circuit around the power amplifier 20, which circuit is capable of correcting minor errors in the output pulses.

A reference read-only memory (ROM) 50 has a preferred pulse envelope stored therein in digital form. Upon the receipt of a proper trigger at a trigger input terminal 52 an address generator and control circuit 53 causes the reference ROM 50 to supply digital signals to a digital-to-analog converter 55. The combination of the ROM 50 and the converter 55 provide a preferred pulse envelope in analog form through a low pass filter 56 and a non-linear network 57 to a second input of the summing amplifier 41. The summing amplifier 41 subtracts the output pulse envelope supplied by the detector 32 and non-linear network 39 from the preferred pulse envelope supplied by the ROM 50 and non-linear network 57. The difference between the two pulses is supplied through the controlled resistance 37 to the integrator 43 and appears at the output thereof as an error signal.

The output of the summing circuit 45 is applied to the input of an amplifier 60, the output of which is connected to a second input of the second modulator 15, and to the input of the an analog-to-digital converter 62. The output of the analog-to-digital converter 62 is connected to a switching circuit 65. The switching circuit 65 has a pair of outputs connected to first and second random access memories 66 and 67, respectively. The switching is accomplished such that memories 66 and 67 alternate roles as input or output memories on alternate pulses. A switching circuit 70 is connected to memories 66 and 67 to supply control signals thereto from address generator and control 53. When the control signals are routed to either of the memories 66 or 67 as an input, they are delayed by delay network 69, however control signals routed to an output memory 66 or 67 are not delayed. The control signals are generated upon receipt of an input trigger on terminal 52. A control signal is also supplied to a hold input of the sample and hold circuit 48. The output of the switching circuit 65 is supplied through a digital-to-analog converter 72 and low pass filter 73 to a second input of the summing circuit 45 and through a resistor 75 to the second input of the first modulator 12. The signal supplied to the second input of the first modulator 12 is a corrected predistorted pulse envelope which, when applied to the power amplifier 20 produces the desired or preferred pulse at the output thereof.

A capacitor 85 is connected between the input and output of the integrator 43. A transmission gate 86 operates at a specific time to connect a resistor 87 in parallel with the capacitor 85 to reduce the integrator gain during the off period. The output of the comparator 35 is applied to one input of a function generator 90, the output of which is supplied to the input of the integrator 43. The function generator 90 and the gate 86 operates in response to signals from the address generator and control 53.

In the specific circuitry illustrated in FIG. 1, the power amplifier 20 has a transfer function generally as illustrated by the curve in FIG. 3. It can be seen that this transfer function is very non-linear with the first portion thereof remaining at substantially 0 out to a first point, designated 1, and then rising relatively slowly to a second point, designated 2, after which the curve rises sharply for a relatively long section before again leveling off. It will of course be understood that if other power amplifiers are utilized they may have a somewhat different transfer function and some of the compensating circuits described herein may require slight modifications, or may not be required.

Figure 2A:
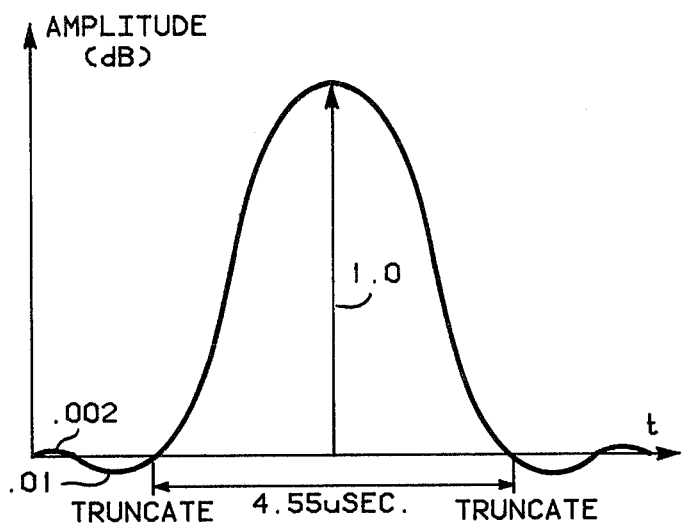
FIGS. 2, A and B, illustrate the time domain and frequency domain, respectively, of a preferred pulse envelope for use in the circuitry of FIG. 1.

The preferred pulse envelope stored in the reference ROM 50 is illustrated in FIG. 2A. The curve illustrated in FIG. 2A generally follows the equation $$F(t) = \left[ \frac{\sin (2\pi K_o t)}{2K_o \pi t} \right]^3$$

where $K_o$ = a constant chosen for a specific rise time.

Figure 2B:
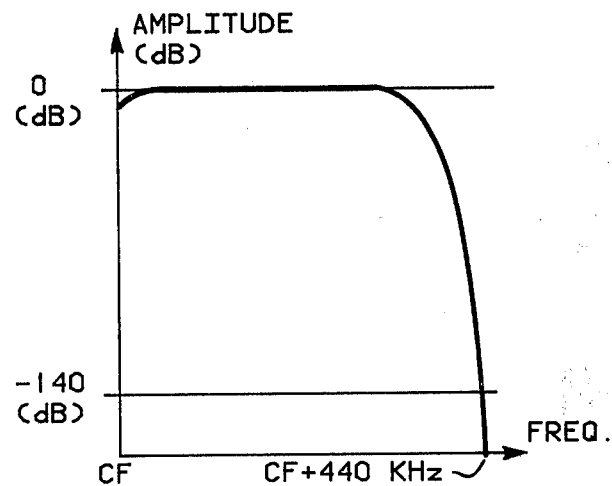

The curve as actually stored in the reference ROM 50 is represented by a plurality of samples (for example 128) with the curve being truncated where it crosses the zero axis (the first time) at either side of the center of the curve. By utilizing the specific curve illustrated and by truncating the curve as shown, the frequency response will be generally as illustrated in FIG. 2B. Thus, it can be seen that the frequency response drops off very sharply so that no signals (frequencies) are produced which will interfere with adjacent channels or the like. The reason that no interference occurs is because of the novel curve being utilized. Because the curve is generated digitally, practical limitations on the number of digital samples used dictate that the curve must be terminated, or truncated, at upper and lower limits. If the function is not truncated, the frequency spectrum will be as shown. Truncation of the time response as shown in FIG. 2A causes very little change in this spectrum. The advantage of this pulse over the gaussian pulse is that it can be truncated close to the pulse center and still have the desired spectrum. The curve with the truncations is generated digitally, however, if such stringent frequency control is not necessary in a specific application a gaussian curve might be generated by analog means.

Because the initial portion of the transfer function for the power amplifier 20 is substantially 0, some compensation must be provided in the predistorted envelope supplied to the modulator 12. The comparator 35 and function generator 90 provide a portion of the compensation required. The comparator 35 is designed to provide an output when the voltage at the output of the detector 32 begins to rise above 0 (Point 1 in FIG. 3). In the present embodiment this is approximately 10 millivolts. The address generator and control circuit 53 supplies a set signal to the function generator 90 at the start of each pulse. FIG. 5 is a waveform of the output of the function generator 90 and a sharp drop or step function is illustrated at time $T_1$ when the set pulse is applied thereto by the address generator and control circuit 53. At some later time, $T_2$, the comparator 35 supplies a reset pulse to the function generator 90 and the output signal goes sharply positive. FIG. 4 illustrates a set of four error signals as they appear at the output of the integrator 43. The four pulses are illustrated in vertical alignment to show the timing, but it will be understood by those skilled in the art that the pulses appear sequentially with pulse 1 appearing first and then pulse 2, etc. It will be noted that each of the error signals starts with a pedestal, which pedestal is formed by the set/reset pulse of the function generator 90. The pedestals can be seen in FIG. 4 between the times $T_1$ and $T_2$. The function generator 90 is constructed so that upon receiving a reset pulse the set function actually goes beyond the normal voltage and returns a very short time later, $T_3$, to normal. This over-shoot is intentionally designed in the function generator 90 to compensate for forward delay in the circuit between the output of the power amplifier 20 and the summing amplifier 41. The voltage excursion is so small that it is virtually undetectable in the error signals of FIG. 4. The waveform generated by the function generator 90 and integrated by the integrator 43 is applied to the sample-and-hold circuit 48 so that the pedestal in the error signal waveforms at the output of the integrator 43 is actually applied negatively to a third input of the summing circuit 45. Because the pedestal is applied negatively it is subtracted from the signal applied to the first input and only the predistored pulse appears at the output of the summing circuit 45. The reasons for this will be apparent presently.

Referring more specifically to FIG. 4 and assuming that the circuit of FIG. 1 has just been turned on so that the first pulse of the sequence is being generated, the output of the integrator 43 will appear as pulse 1 in FIG. 4. This pulse includes the pedestal generated by the function generator 90 but otherwise has not had the benefit of being operated upon by the digital feedback circuitry of FIG. 1. Pulse 1 at the output of the integrator 43 is supplied through the resistor 46 to the first modulator 12 for modulating the next gated pulse of RF input. The pulse 1 is also supplied to the first input of the summing circuit 45. The sample-and-hold circuit 48 supplies a pedestal to the third input of the summing circuit 45 so that only the pulse portion of the error signal is applied through the A/D converter 62 and the demultiplexing circuit 65 to the RAM 66 for storage. Since no previous pulses occured there are no pulses stored in the RAMs 66 and 67 and, thus, no signal is applied to the second input of the summing circuit 45.

The second modulated RF pulse is amplified by the power amplifier 20 and the envelope thereof, from the detector 32, is applied to the summing amplifier 41 along with the preferred pulse from the ROM 50. The summing amplifier 41 and integrator 43 provide an output signal representative of the errors between the preferred envelope and the actual envelope, which errors (along with the pedestal) appear as pulse 2 in FIG. 4. The error signal (pulse 2) is applied through the resistor 46 to the first modulator 12 along with the stored pulse from RAM 66, which is applied through switching circuit 70, converter 72, low pass filter 73 and resistor 75. The delay circuit 69 provides delay for control signals used by the input RAM. The amount of this delay is identical to the delay through the low pass filter 73. In this manner, feedback information regarding any given location from the output RAM which is delayed by the filter 73 will be stored in the corresponding input RAM location. While the delay T is illustrated as a separate network it will be understood by those skilled in the art that it could be incorporated into the address generator and control circuit 53, for example, if desired.

The pulse being read out of RAM 66 is supplied to the second input of the summing circuit 45, along with the error signals supplied to the first input thereof minus the pedestal supplied to the third input, so that the corrected predistorted pulse is stored in RAM 67 while RAM 66 is reading out the previously stored pulse. The pulse stored in RAM 67 is then utilized in conjunction with the next error signal (pulse 3 of FIG. 4) to produce the next modulated RF pulse from the first modulator 12 and to supply the next corrected predistorted pulse to RAM 66.

Thus, the digital feedback loop compares each output pulse to the stored preferred pulse from ROM 50 and utilizes the error signals at the output of the integrator 43, in conjunction with the stored previous predistorted pulse, to generate a corrected predistorted pulse which is in turn utilized to modulate the next RF pulse. This combination of analog and digital feedback envelope correction circuitry operates very rapidly so that only the first pulse in a sequence varies somewhat from the preferred pulse. The amount of variation in the first pulse is determined by the analog portion of the feedback loop and should be substantially unnoticeable in a series of transmitted pulses.

Any non-linearities in the detector 32 will affect the feedback loop and, it is an advantage of this approach that the waveforms stored in the ROM 50 can be programmed to compensate for non-linearities of the detector 32, since it is difficult to provide a detector with a very wide linear range. Through experimentation it has been found that the detector 32 should be linear over a very wide range, for example, at least 50 db. A detector which will fulfil this requirement is illustrated in FIG. 6. Referring specifically to FIG. 6, an input terminal 110 is connected to one side of a resistor 111, the other side of which is grounded, and to one plate of a capacitor 113. The opposite plate of the capacitor 113 is connected to the cathode of a diode 115, the anode of which is connected to ground and to the anode of a diode 117, the cathode of which is connected to an output terminal 120. The cathode of the diode 117 is also connected to one plate of a capacitor 121, the other plate of which is grounded and to one side of a current source 123, the other side of which is grounded. It will of course be understood that the detector illustrated in FIG. 6 is simply illustrated as an example of a detector having a linear range greater than 50 db and many other detectors can be devised by those skilled in the art.

While the analog and digital loops described will generally provide the desired pulse shape and amplitude at the output of the power amplifier 20, it is helpful to the operation if the gain versus output voltage of the circuitry is maintained as constant as possible. That is, the loop gain should remain constant as pulses progress along the transfer function illustrated in FIG. 3. To supply this characteristic, the circuitry of FIG. 1 is provided with three different gain changing circuits any one of which may be utilized or any combination of which might be utilized to perform the function. The three gain changing circuits are as follows: 1, the second modulator 15 and amplifier 60; 2, control network 38 driving controlled resistor 37; and 3, the non-linear networks 39 and 57.

In the first gain changing network the amplifier 60 provides a signal to the second modulator 15 when the voltage supplied from the summing circuit 45 exceeds the voltage at the second point on the transfer function of FIG. 3, which is the point at which the power amplifier incremental gain becomes large in this embodiment. The second modulator 15 contains amplifier 16 which has a gain of 30 and the pin diode reflective modulator 17 that has an incremental gain which can be represented by a hyperbolic function. It was determined that the hyperbolic function of the pin diode reflective modulator 17 is preferred as compared to a linear modulator.

Figure 9:
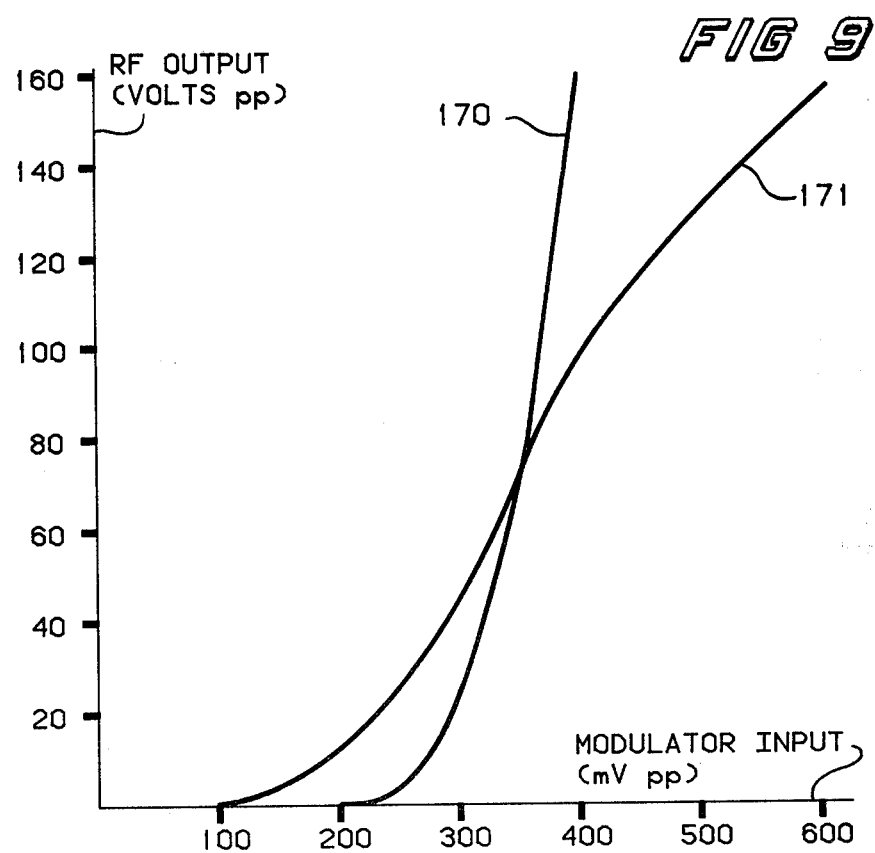
FIG. 9 illustrates a pair of curves representing power amplifier RF output versus modulator control voltage with linear and reflective corrector modulators.

The reflective pin diode modulator correction circuit (reflective corrector) comprised of linear modulator 12, amplifier 16 and pin diode modulator 17 posses a nonlinear transfer function as illustrated in FIG. 8. It is included in the control loop to minimize the loop gain variation over the RF signal dynamic range. FIG. 9, curve 170 illustrates the power amplifier transfer function that results from using only linear modulator 12, compared to the less severe transfer function with more constant slope of curve 171 that results from including amplifier 16 and pin diode modulator 17. The slope of the curve represents incremental loop gain and would ideally be constant (for a linear amplifier).

Figure 10:
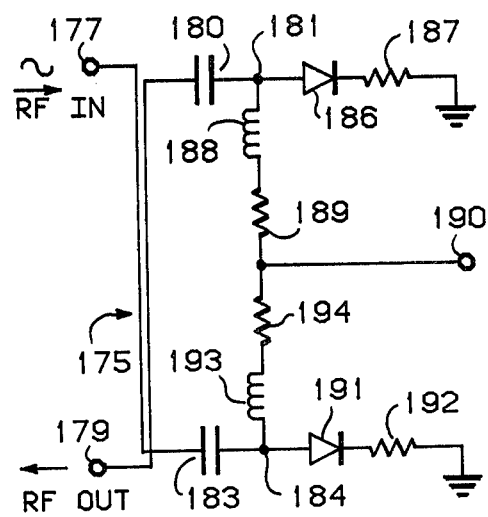
FIG. 10 is a schematic diagram of a typical reflective pin diode modulator.

FIG. 10 illustrates a specific example of pin diode modulator 17. A quadrature hybrid coupler 175 has an RF input terminal 177, which in FIG. 1 receives an RF signal from amplifier 16, and an RF output terminal 179, which in FIG. 1 supplies the RF output signal to power amplifier 20. A third terminal of the coupler 175 is connected through a capacitor 180 to a junction 181. A fourth terminal of the coupler 175 is connected through a capacitor 183 to a junction 184. The junction 181 is connected through a pin diode 186 and terminating resistor 187 to ground. The junction 181 is also connected through a series connected inductance 188 and resistor 189 to a control voltage input terminal 190, which in FIG. 1 is connected to the output of comparator 60. The junction 184 is connected through a pin diode 191 and terminating resistor 192 to ground. The junction 184 is also connected through a series connected inductance 193 and resistor 194 to the input terminal 190.

The transfer function, including a sensitivity parameter, $K_d$, of the pin diode modulator 17 is given by the equation $$\frac{v_2}{v_1} = \frac{K_d}{K_d + 100v_3}$$

where:
 $v_1$ = RF input
 $v_2$ = RF output
 $v_3$ = control voltage at input.

Figure 11:
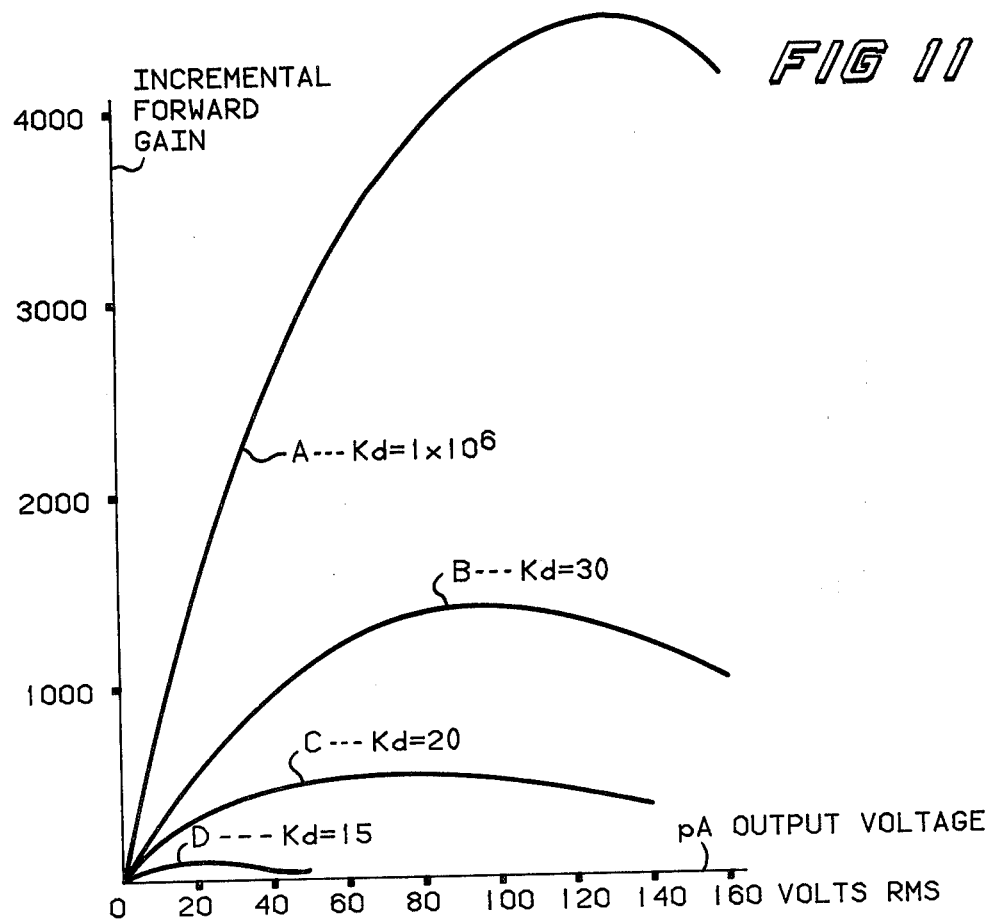
FIG. 11 illustrates four curves representing incremental gain versus four different reflective corrector constants.

In this embodiment $K_d$ has been chosen to be equal to 20. FIG. 11 illustrates the slope or incremental gain variation for several values of $K_d$. With $K_d$ equal to 20 the result is a nearly constant gain (curve C in FIG. 11) as compared to the extreme gain variations that result from a high value of $K_d$ (e.g. $1 \times 10^6$ of curve A) which produce essentially no compensation of the reflective corrector.

The use of a properly chosen nonlinear transfer function for the reflective corrector is important, since the compensated incremental gain should be as constant as possible. The compensated incremental gain must never become negative because that causes loop instability. Thus, the first gain changing circuit operates on the RF applied to the power amplifier 20 to alter the amplitude of signals applied thereto so that the loop gain tends to remain constant as the level of an input pulse progresses along the transfer function of the power amplifier 20.

The second gain changing network includes a soft clamp, generally designated 81, connected to receive the detected envelope from the resistor 36 and supply a signal to the control network 38. The output of the control network 38 is connected to the gate of a field effect transistor (FET) which operates as the voltage controlled resistance 37. The second gain changing circuit provides a means of changing the integrator gain in response to the output envelope level in a smooth, continuous way.

The voltage controlled resistance 37 at the output of the integrator 43 enables the gain and bandwidth characteristics of the loop to be adjusted in a continuous manner. The control network 38 connected to the detected output converts that signal into a control voltage which adjusts the channel resistance of the FET (voltage controlled resistance 37). This configuration enables the gain of the loop feedback circuitry to be high while the power amplifier gain is low, which occurs at low power output levels. As the power amplifier gain increases, the detected output signal causes the control network 38 to increase the resistance of the FET to decrease the effective gain of the integrator 43. This process enables the loop gain to be held relatively constant, even though the power amplifier gain varies greatly at varying output levels. The "soft" clamp 81 sets the upper limit for action of the resistance control network 38 and avoids an abrupt cessation of change in controlled resistor 37 which would produce a step change in incremental gain.

Figure 7:
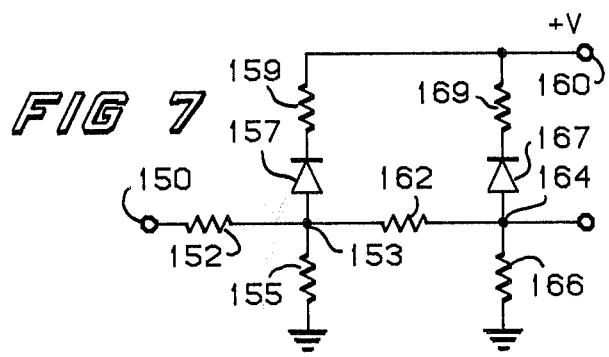
FIG. 7 is a schematic diagram of a non-linear network utilized in the circuitry of FIG. 1.

The third gain changing circuit is the non-linear network 39 positioned between the output of the detector 32 and the summing circuit 41. A disadvantage of this circuit is that an identical non-linear network 57 must be placed in the circuit connecting the ROM 50 to the summing amplifier 41 however the networks are closely matched and any residual errors are corrected in the same manner as the non-linearities of the diode detector are, by predistorting the reference pulse. A typical non-linear network which may be utilized for the networks 39 and 57 is illustrated in FIG. 7. An input terminal 150 is connected through a resistor 152 to a junction 153. The junction 153 is connected through a resistor 155 to ground and to the anode of a diode 157. The cathode of the diode 157 is connected through a resistor 159 to a terminal 160 adapted to have a positive source of voltage (not shown) supplied thereto. The junction 153 is also connected through a resistor 162 to a second junction 164. The junction 164 is connected through a resistor 166 to ground and to the anode of a diode 167. The cathode of the diode 167 is connected through a resistor 169 to the positive junction 160. The junction 164 serves as the output of the circuit. The diodes 157 and 167 of the non-linear network are connected to turn on as the voltage supplied thereto increases with the diode 157 turning on first and the diode 167 turning on after the voltage increases to a further pre-determined point. Thus, the non-linear network of FIG. 7 provides a two-step gain changing function with the diodes set to turn on, for example, at points 1 and 2 of the transfer function illustrated in FIG. 3. The third gain changing circuit also operates on video and approaches a step function change in incremental gain to the degree that the diode dynamic resistance can be neglected. It will of course be understood that many other types of non-linear networks might be utilized and one skilled in the art might devise a greater number of step functions, or networks having a continuous change.

Thus, three gain changing circuits are illustrated which aid in maintaining the gain versus output voltage of the circuitry relatively constant. It will of course be understood by those skilled in the art that other types of gain changing circuits may be utilized in addition to or instead of the gain changing circuits illustrated. Further, some changes in the manner of connecting the various gain changing circuits might also be provided as, for example, the control network 38 of the second gain changing circuit might be connected to sense the voltage rise in the pulse from the ROM 50, rather than in the pulse from the detector 32. Regardless of the type or connection of the gain changing circuits the primary importance thereof is in maintaining the loop gain constant as the signals applied to the power amplifier progress along the transfer function, whatever that may be, of the power amplifier being utilized.

Figure 12:
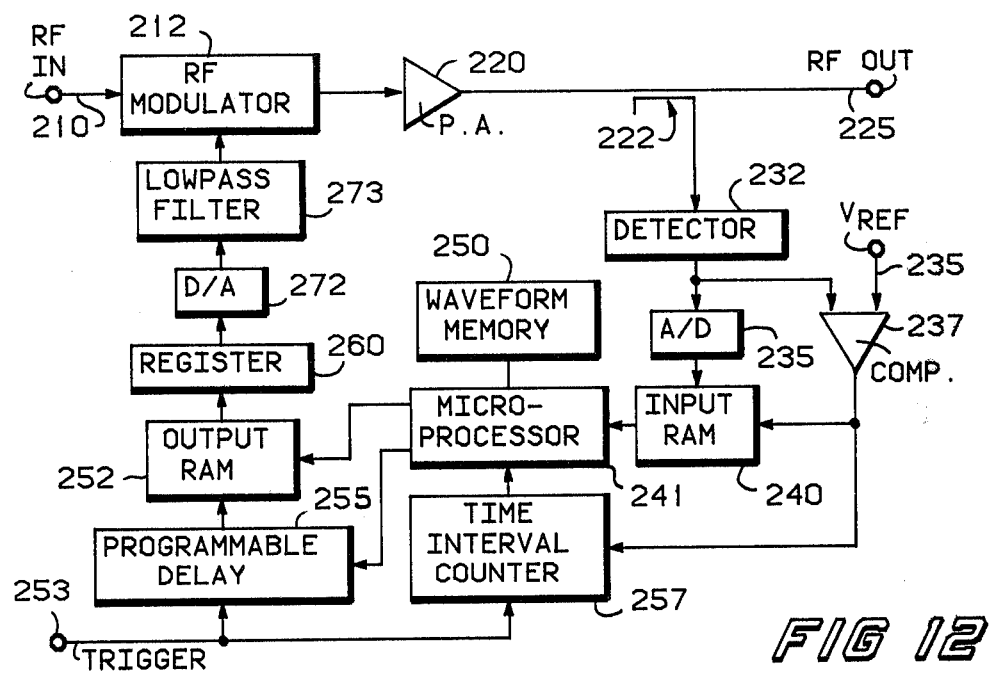
FIG. 12 is the block diagram of another embodiment of a power amplifier and envelope correction circuitry utilizing the present invention.

Referring specifically to FIG. 12, a second embodiment of an envelope correction circuitry and power amplifier is illustrated. The circuitry illustrated in FIG. 1 is very fast and can compensate for pulse changes from pulse to pulse. However, if the circuitry is to be utilized in an application wherein the pulse changes are slower, the circuitry of FIG. 12 may be sufficient.

An input terminal 210 supplies the RF signal to an RF modulator 212. The output of the modulator 212 is connected to a power amplifier 220, the output of which is available at an output terminal 225. A coupling circuit 222 couples a portion of the output signal from the power amplifier 220 to a detector 232. The output of the detector 232 is converted to a digital signal by an analog to digital converter 235 and is also supplied to one input of a comparator 237. A second input 238 of the comparator 237 is adapted to have a reference voltage supplied thereto which dictates the point at which the input signal produces an output from the comparator 237. The digital representation of the envelope of the output pulse is supplied by the converter 235 to an input random access memory 240. The random access memory 240 is activated by a signal from the comparator 237. The RAM 240 supplies the digital representation of the output pulse to a microprocessor 241 in an appropriate timing sequence. A waveform memory 250, which may be for example a read-only memory, supplies a digital representation of a preferred pulse envelope to the microprocessor 241 in a proper timing sequence so that the preferred pulse envelope can be compared to the actual pulse envelope by the microprocessor 241. Using an efficient algorithm, the microprocessor 241 makes the comparison and provides a digital representation of a predistorted pulse envelope to an output RAM 252. In effect, the processor calculates a correction function uniquely related to the power amplifier transfer function.

The algorithm utilizes a look up table containing information obtained from the previous output pulse as well as the input used to produce that pulse. This technique allows the processor to predict the required input to produce the preferred output from the present pulse. This information includes both amplitude and time delay data which are utilized to create a pulse with preferred timing and shape characteristics.

The output data from previous pulses form a look-up table which contains a maximum value which is at least as great as the maximum desired output. The input data is in another look-up table corresponding to each point on the output. For each point of the preferred output the algorithm searches through the output table to find two values which enclose this desired output. Interpolation between these values gives a corresponding interpolated input value. The interpolation technique could include linear or higher-order approximations. By calculating the time of occurrence of mean value of the input and output tables, the time delay is determined. By taking the interpolated values and adjusting for time delay, the input array for the next pulse is determined. Timing accuracy can be done with greater precision than the sampling time by interpolation between sampling points.

A trigger input terminal 253 is connected to a programmable delay 255, which also receives an input from the microprocessor 241 and supplies an output to the output RAM 252, and to a time interval counter 257, which also receives an input from the comparator 237 and supplies an output to the microprocessor 241. A pulse on the trigger input terminal 253 causes the time interval counter 257 to begin a timing sequence. The trigger input pulse is also delayed by the programmable delay 255 and is utilized to initiate output of the waveform data stream from the output RAM 252. The comparator 237 is connected to the output of the detector 232 to provide a pulse as soon as the output increases to a small value, for example 10 millivolts. The pulse from the comparator 237 initiates acquisition of wave form data into the input RAM 240, and stops the time interval counter 257. To provide accurate delay of the output pulse relative to the trigger input, the microprocessor 241 examines the interval counter 257 and the contents of the input RAM 240, and programs the programmable delay 255 for the desired time delay.

The digital representation of the predistorted pulse envelope from the output RAM 252 is supplied through a register 260 to a digital-to-analog converter 272. The analog signal from the converter 272 is supplied through a low pass filter 273 to the modulator 212. Thus, the waveform memory 250 generates a preferred pulse envelope and the microprocessor 241 compares the preferred pulse envelope to the actual pulse envelope and supplies a predistorted pulse envelope to the modulator 212. The predistorted pulse envelope is utilized to modulate the RF input from the terminal 210 so that the pulse applied to the power amplifier 220 takes the shape of the preferred pulse at the output thereof. Again, the preferred pulse is the pulse illustrated in FIG. 2A.

Thus, improved envelope correction circuitry for use with a power amplifier is illustrated wherein very accurate control of the output pulse envelope is provided. The present circuitry allows the most cost effective power amplifier design since peak power compression and small signal non-linearities are acceptable power amplifier parameters whereby the minimum number of expensive RF devices may be used. The correction approach being basically high speed digital processing is very accurate, repeatable and stable. The use of pipeline high speed parallel processing rather than serial processing increases cost and complexity but provides much greater speed.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

We claim:

1. A power amplifier and envelope correction circuitry comprising:
   (a) a power amplifier having an output and an input;
   (b) envelope generating means for generating a preferred envelope;
   (c) error determining means, coupled to the output of said amplifier and to said envelope generating means, including a comparison circuit for comparing envelopes at the outputs thereof to determine errors therebetween and provide error signals representative of the difference between the compared envelopes and further including storage means for storing a previous predistorted envelope and combining circuitry for combining the error signals with the stored envelope to produce a corrected predistorted envelope; and
   (d) modulating means coupled to the input of said amplifier and to receive the corrected predistorted envelope from said error determining means for modulating input signals applied to the input of said amplifier so that output signals at the output of said amplifier have an envelope substantially similar to the generated preferred envelope.

2. Correction circuitry as claimed in claim 1 wherein the envelope generating means includes a digital memory with the preferred envelope stored therein in digital form.

3. Correcting circuitry as claimed in claim 1 wherein the modulating means includes gain changing circuitry operative during predetermined portions of the envelope.

4. Correcting circuitry as claimed in claim 3 wherein the gain changing circuitry includes a pin diode reflective modulator coupled between the modulating means and the input of the amplifier.

5. Correcting circuitry as claimed in claim 1 wherein the error determining means includes a controlled resistance means for changing the gain thereof.

6. Correcting circuitry as claimed in claim 5 wherein the controlled resistance includes a field effect transistor positioned in a path of the error signals, said field effect transistor having a gate connected to be controlled by the output of the power amplifier.

7. Correcting circuitry as claimed in claim 1 wherein the error determining means includes a microprocessor.

8. A TACAN transmitter comprising:
   (a) a source of RF signals;
   (b) a power amplifier having an input and an output;
   (c) envelope generating means for generating a preferred envelope;
   (d) error determining means coupled to the output of said amplifier and to said envelope generating means for comparing envelopes at the outputs thereof and producing error signals representative of differences between envelopes at the output of said amplifier and generated preferred envelopes;
   (e) storage means coupled to said error determining means for storing a previous corrected envelope and supplying the stored envelope at an output; and
   (f) modulating means coupled to receive the RF signals from said source, the error signals from said error determining means and the stored envelope from said storage means for providing a pulse of RF energy having an envelope formed from the stored envelope and the error signal, said modulating means being coupled to the input of said power amplifier for supplying the pulses of RF energy thereto.

9. A TACAN transmitter as claimed in claim 8 wherein the envelope generating means and the storage means both include digital devices.

10. A TACAN transmitter as claimed in claim 8 wherein the error determining means includes an analog summing device for comparing signals at the output of the amplifier and at the output of the envelope generating means, and an analog integrator coupled to receive the signals from the summing device.

11. A TACAN transmitter as claimed in claim 10 including pedestal generating circuitry coupled to the summing device for incorporating a pedestal in the error signal and coupled to the storage means for subtracting the pedestal from the stored envelope.

12. A method of generating a train of RF pulses, each having a preferred envelope, through a non-linear power amplifier comprising the steps of:
   (a) generating a preferred pulse envelope;
   (b) sensing each pulse at the output of the amplifier and comparing each sensed pulse envelope to the preferred pulse envelope to determine any errors;
   (c) utilizing the errors to generate predistorted pulse envelopes including storing a previously generated predistorted pulse envelope, supplying the stored pulse envelope and the errors to perform the modulating step, and using the errors to improve the stored pulse envelope for the next sequence of steps;

(d) modulating an RF signal with the predistorted pulse envelopes; and (e) applying the modulated RF signal to the non-linear power amplifier to generate a train of RF pulses each having the preferred envelope.

13. A method of generating a train of RF pulses as claimed in claim 12 wherein the step of generating a preferred pulse envelope includes the step of storing digital representations of a plurality of points defining the preferred pulse envelope.

14. A method of generating a train of RF pulses as claimed in claim 13 wherein the step of generating a preferred pulse envelope includes the further steps of converting the stored digital representations, in a proper sequence to form the preferred pulse envelope, into an analog signal and low pass filtering the analog signal to form a smooth envelope.

15. A power amplifier and envelope correction circuitry comprising:

(a) a power amplifier having an output and an input;

(b) envelope generating means for generating a preferred envelope generally in accordance with the equation $$F(t) = \left[ \frac{\sin (2\pi K_o t)}{2K_o \pi t} \right]^3$$

where $K_o$ = a constant chosen for a specific rise time and the envelope is truncated at approximately the first zero crossings;

(c) error determining means coupled to the output of said amplifier and to said envelope generating means for comparing envelopes at the outputs thereof to determine errors therebetween and produce a predistorted envelope from the comparison; and (d) modulating means coupled to the input of said amplifier and to receive the predistorted envelope from said error determining means for modulating input signals applied to the input of said amplifier so that output signals at the output of said amplifier have an envelope substantially similar to the generated preferred envelope.

16. A method of generating a train of RF pulses, each having a preferred envelope, through a non-linear power amplifier comprising the steps of:

(a) generating a preferred pulse envelope generally in accordance with the equation $$F(t) = \left[ \frac{\sin (2\pi K_o t)}{2K_o \pi t} \right]^3$$

where $K_o$ = a constant chosen for a specific rise time, and the envelope is truncated at approximately the first zero crossings;

(b) sensing each pulse at the output of the amplifier and comparing each sensed pulse envelope to the preferred pulse envelope to determine any errors;

(c) utilizing the errors to generate predistorted pulse envelopes;

(d) modulating an RF signal with the predistorted pulse envelopes; and (e) applying the modulated RF signal to the non-linear power amplifier to generate a train of RF pulses each having the preferred envelope.

* * * * *